US010619291B2

(12) United States Patent
Buet et al.

(10) Patent No.: US 10,619,291 B2
(45) Date of Patent: Apr. 14, 2020

(54) DEVICE FOR COATING ONE OR MORE YARNS BY A VAPOR DEPOSITION METHOD

(71) Applicant: SAFRAN CERAMICS, Le Haillan (FR)

(72) Inventors: Emilien Buet, Saint Medard en Jalles (FR); Simon Thibaud, Pessac (FR); Adrien Delcamp, Merignac (FR); Cédric Descamps, Eysines (FR)

(73) Assignee: SAFRAN CERAMICS, Le Haillan (FR)

(*) Notice: Subject to any disclaimer, the term of this patent is extended or adjusted under 35 U.S.C. 154(b) by 0 days.

(21) Appl. No.: 15/777,538

(22) PCT Filed: Nov. 18, 2016

(86) PCT No.: PCT/FR2016/053008
§ 371 (c)(1),
(2) Date: May 18, 2018

(87) PCT Pub. No.: WO2017/085420
PCT Pub. Date: May 26, 2017

(65) Prior Publication Data
US 2018/0347106 A1 Dec. 6, 2018

(30) Foreign Application Priority Data

Nov. 19, 2015 (FR) .................................... 15 61150

(51) Int. Cl.
C23C 16/44 (2006.01)
C23C 16/455 (2006.01)
(Continued)

(52) U.S. Cl.
CPC ........... D06M 11/58 (2013.01); C23C 16/342 (2013.01); C23C 16/4412 (2013.01);
(Continued)

(58) Field of Classification Search
None
See application file for complete search history.

(56) References Cited

U.S. PATENT DOCUMENTS 3,367,304 A    2/1968  Robbins
5,322,711 A *  6/1994  Gabor .................. C04B 41/009
                                              427/249.3
(Continued)

FOREIGN PATENT DOCUMENTS

DE    34 24 166 A1   2/1986
DE    94 21 895 U1   3/1997
(Continued)

OTHER PUBLICATIONS

International Search Report as issued in International Patent Application No. PCT/FR2016/053008, dated Jan. 24, 2017.
(Continued)

Primary Examiner — Karla A Moore
(74) Attorney, Agent, or Firm — Pillsbury Winthrop Shaw Pittman LLP

(57) ABSTRACT

A device for coating one or more yarns by a vapor deposition method, the device including a treatment chamber extending along a longitudinal axis and having a treatment zone between an internal and an external circumferential wall, and within which at least one yarn is to be coated by performing a vapor deposition method; a conveyor system to transport the at least one yarn through the treatment zone; an injector device to inject a treatment gas phase into the treatment zone through an inlet orifice present in the internal or external circumferential wall; and a removal device to remove the residual gas phase from the treatment zone through an outlet orifice present in the internal or external circumferential wall, the inlet and the outlet orifice being situated in a common plane perpendicular to the longitudinal axis of the chamber and being offset around the circumferential direction of the chamber.

10 Claims, 4 Drawing Sheets

(51) Int. Cl.
*C23C 16/54* (2006.01)
*C23C 16/34* (2006.01)
*C23C 14/56* (2006.01)
*D06M 11/58* (2006.01)
*D06B 3/04* (2006.01)
*D06M 101/40* (2006.01)

(52) U.S. Cl.
CPC ...... *C23C 16/45502* (2013.01); *C23C 16/545* (2013.01); *D06B 3/045* (2013.01); *C23C 14/562* (2013.01); *C23C 16/45563* (2013.01); *D06M 2101/40* (2013.01); *D10B 2101/08* (2013.01); *D10B 2101/12* (2013.01); *D10B 2101/16* (2013.01)

(56) References Cited

U.S. PATENT DOCUMENTS

2006/0275548 A1* 12/2006 Storer ................. C23C 14/0021 427/251
2007/0099527 A1 5/2007 Brun et al.
2013/0064977 A1* 3/2013 Vermeer ........... C23C 16/45551 427/255.5
2014/0147592 A1* 5/2014 Hart ........................ B05C 3/005 427/255.28
2014/0186527 A1* 7/2014 Teo .......................... C23C 16/26 427/177
2018/0347048 A1* 12/2018 Buet ...................... D06M 11/73

FOREIGN PATENT DOCUMENTS

EP    1 277 874 A1   1/2003
FR    1 564 841 A    4/1969
FR    2 727 435 A1   5/1996

OTHER PUBLICATIONS

International Preliminary Report on Patentability and the Written Opinion of the International Searching Authority as issued in International Patent Application No. PCT/FR2016/053008, dated May 22, 2018.

* cited by examiner

DEVICE FOR COATING ONE OR MORE YARNS BY A VAPOR DEPOSITION METHOD

CROSS REFERENCE TO RELATED APPLICATIONS

This application is the U.S. National Stage of PCT/FR2016/053008 filed Nov. 18, 2016, which in turn claims priority to French Application No. 1561150, filed Nov. 19, 2015. The contents of both applications are incorporated herein by reference in their entirety.

BACKGROUND OF THE INVENTION

The invention relates to devices and methods for coating one or more yarns by a vapor deposition method.

Ceramic matrix composite (CMC) materials are used at operating temperatures that are relatively high. Such materials comprise fiber reinforcement made up of yarns of ceramic or carbon materials present within a ceramic matrix.

While making parts out of CMC, a fiber texture that is to form the fiber reinforcement of the part may initially be obtained, e.g. by three-dimensional weaving. The fiber texture is then shaped in order to obtain a fiber preform having a shape that is close to the shape of the part that is to be fabricated. The preform is then densified in order to form the matrix and thus obtain the final part, with the matrix being made by way of example in full or in part by a chemical vapor infiltration (CVI) method or by a melt infiltration (MI) MI method, for example. Prior to the textile forming step (weaving, braiding, . . . ), the yarns may have been coated in an interphase coating serving to slow down rupture of the fibers of the yarns by cracks that start initially within the matrix. By way of example, the embrittlement-release interphase coating may be made of a material of lamellar structure that, on a crack reaching the interphase, is capable of dissipating the cracking energy by localized un-bonding at atomic scale so that the crack is deflected within the interphase. By way of example, materials constituting the embrittlement-release interphase may be pyrolytic carbon (PyC), and boron nitride (BN), which present a lamellar structure. By way of example, the interphase coating may be formed by chemical vapor deposition (CVD), by chemical vapor infiltration (CVI), or indeed by a liquid technique.

Devices suitable for continuously coating a plurality of yarns with an interphase by chemical vapor deposition are proposed in the literature. Such devices may include a treatment chamber through which a plurality of yarns for coating are transported by being driven by a pulley system. A reactive gas mixture is injected into the treatment chamber via an inlet orifice in order to form the interphase coating on the yarns by chemical vapor deposition. Any reactive gas mixture that has not reacted, together with by-products of the reaction are pumped out via an outlet orifice that is offset from the inlet orifice along the longitudinal axis of the treatment chamber. In such devices, the injected gas mixture flows along the longitudinal axis of the treatment chamber until it is pumped out through the outlet orifice. Multilayer interphase coatings can be made by placing a plurality of units of this type in series each including a device for injecting a gas phase and a device for removing the residual gas phase.

Nevertheless, the reliability of known methods can be improved insofar as, in those methods, it can be difficult for the pulley systems to maintain adequate yarn tension, and insofar as relatively high travel speeds of the yarns can be used, which can lead to certain yarns escaping from grooves in the conveyor pulleys.

In addition, it can be desirable to provide devices that enable the number of yarns that can be treated per unit time to be increased.

Also known are documents FR 1 564 841, US 2007/0099527, DE 94 21 895, EP 1 277 874, and DE 3 424 166, which describe fiber coating methods. Also known is Document FR 2 727 435, which describes a reactive chemical vapor deposition (CVD) method.

There thus exists a need to provide devices enabling the reliability of methods for coating one or more yarns by vapor deposition to be improved.

There also exists a need to provide devices enabling the number of yarns that can be treated per unit time to be increased.

OBJECT AND SUMMARY OF THE INVENTION

To this end, in a first aspect, the invention provides a device for coating one or more yarns by a vapor deposition method, the device comprising at least:
- a treatment chamber extending along a longitudinal axis and having at least one treatment zone situated between an internal circumferential wall and an external circumferential wall, and within which at least one yarn is to be coated by performing a vapor deposition method;
- a conveyor system configured to transport said at least one yarn through the treatment zone;
- an injector device configured to inject a treatment gas phase into the treatment zone through at least one inlet orifice present in the internal or external circumferential wall; and
- a removal device configured to remove the residual gas phase from the treatment zone through at least one outlet orifice present in the internal or external circumferential wall, said inlet orifice and said outlet orifice being situated in a common plane perpendicular to the longitudinal axis of the treatment chamber and being offset around the circumferential direction of the treatment chamber.

Said plane perpendicular to the longitudinal axis of the treatment chamber intersects a portion of the inlet orifice and a portion of the outlet orifice. This plane may optionally intersect the inlet orifice and the outlet orifice in their centers. It is thus possible for the inlet orifice and the outlet orifice to be offset a little along the longitudinal axis of the treatment chamber so long as a portion of each of these orifices is situated in a common plane perpendicular to the longitudinal axis.

The device of the invention advantageously presents a length and a size that are small. Because of the short length of the device, the invention makes it easier to impose an appropriate yarn tension during vapor deposition. In particular, the fact that the treatment chamber presents a length that is short compared with prior art devices serves advantageously to enable slower travel speeds to be used, but without that increasing the duration of yarn treatment, thus serving advantageously to reduce any risk of the yarn(s) separating from the conveyor system. In addition, it is advantageously possible to control the conditions of vapor deposition in the treatment zone in reliable manner, given that the treatment zone is short in length. Furthermore, using a treatment zone that is annular in shape, being situated between an internal circumferential wall, and an external circumferential wall serves advantageously to make it possible to position the yarns for treatment around the circumference of the treatment zone, thereby making it possible to increase the quantity of yarns that are treated per unit time compared with a configuration in which the yarns are positioned along a diameter of a treatment chamber.

The device may also include a heater system configured to heat the treatment zone.

In an embodiment, the device may have a plurality of inlet orifices and a plurality of outlet orifices.

Such an embodiment serves advantageously to cover a relatively large number of yarns uniformly.

In an embodiment, the inlet orifices and the outlet orifices may be offset so that each of the outlet orifices is positioned between two inlet orifices around the circumferential direction.

In an embodiment, said inlet orifices and said outlet orifices may be uniformly distributed around the circumferential direction.

Such an embodiment serves advantageously to further improve the uniformity of the coating formed on the various treated yarns.

In an embodiment, the inlet orifice(s) may be situated respectively in the internal or external circumferential wall, and the outlet orifice(s) may be situated respectively in the external or internal circumferential wall. In other words, under such circumstances, when the inlet orifices are situated in the internal circumferential wall, the outlet orifices are situated in the external circumferential wall, and when the inlet orifices are situated in the external circumferential wall, the outlet orifices are situated in the internal circumferential wall.

Such an embodiment serves advantageously to further improve the uniformity of the coating formed on the various treated yarns.

In an embodiment, the conveyor system may include an element for adjusting the travel speed of said at least one yarn through the treatment chamber.

Such a characteristic serves advantageously to make it easier to vary the thickness of the layer(s) formed by modifying the travel speed of said at least one yarn through the treatment zone.

In an embodiment, the device may include at least one perforated element present in the treatment chamber and defining the treatment zone laterally, together with gaskets present between said perforated element and the internal or external circumferential wall of the treatment chamber. In an embodiment, the device may present at least first and second perforated elements of this type, the first perforated element being present facing the internal circumferential wall and the second perforated element being present facing the external circumferential wall.

The present invention also provides a method of treating one or more yarns by a vapor deposition method by using a device as described above, the method comprising at least the following steps:
  using the injector device to inject the gas phase into the treatment zone through said inlet orifice;
  using the conveyor system to cause at least one yarn to be transported through the treatment zone so as to form a layer on said at least one yarn by vapor deposition from the injected gas phase; and
  removing the residual gas phase from the treatment zone through said outlet orifice.

Said layer may be deposited while said at least one yarn is being moved by the conveyor system through the treatment zone.

In an implementation, said at least one yarn may be transported continuously by the conveyor system through the treatment chamber. In other words, said at least one yarn does not stop while it is passing through the treatment chamber. Under such circumstances, throughout its path through the treatment chamber, said at least one yarn is traveling at a non-zero speed.

In an implementation, said at least one yarn may make a single pass through the treatment chamber.

The vapor deposition method that is performed may be chemical vapor deposition (CVD), reactive chemical vapor deposition (RCVD), or physical vapor deposition (PVD).

In an implementation, the layer may be formed by chemical vapor deposition (adding material on the surfaces of the yarns) or by reactive chemical vapor deposition (transformation of the material present at the surface of the yarns).

In an implementation, the layer may be an interphase coating layer.

By way of example, the interphase coating layer may be made of pyrolytic carbon (PyC), of boron nitride (BN), of boron doped carbon (BC), of silicon nitride ($Si_3N_4$), or of a mixed boron and silicon carbide (Si—B—C).

The present invention further provides a method of fabricating a composite material part, the method comprising at least the following steps:
  coating a plurality of yarns with an interphase coating at least by performing a method as described above;
  forming a fiber preform at least by performing one or more textile operations on yarns coated in this way with the interphase coating; and
  densifying the fiber preform with a matrix in order to obtain a composite material part.

Preferably, the fiber preform is obtained by weaving, e.g. by three-dimensional weaving, using yarns coated by interphase coating.

The matrix may comprise a ceramic material such as silicon carbide, or it may be made of carbon. The matrix may be made by any known type of method such as chemical vapor infiltration or melt infiltration, for example.

By way of example, the part that is made may be a turbine engine blade or a turbine ring sector, for example.

BRIEF DESCRIPTION OF THE DRAWINGS

Other characteristics and advantages of the invention appear from the following description of particular embodiments of the invention given as non-limiting examples, and with reference to the accompanying drawings, in which.

DETAILED DESCRIPTION OF EMBODIMENTS

Figure 1:
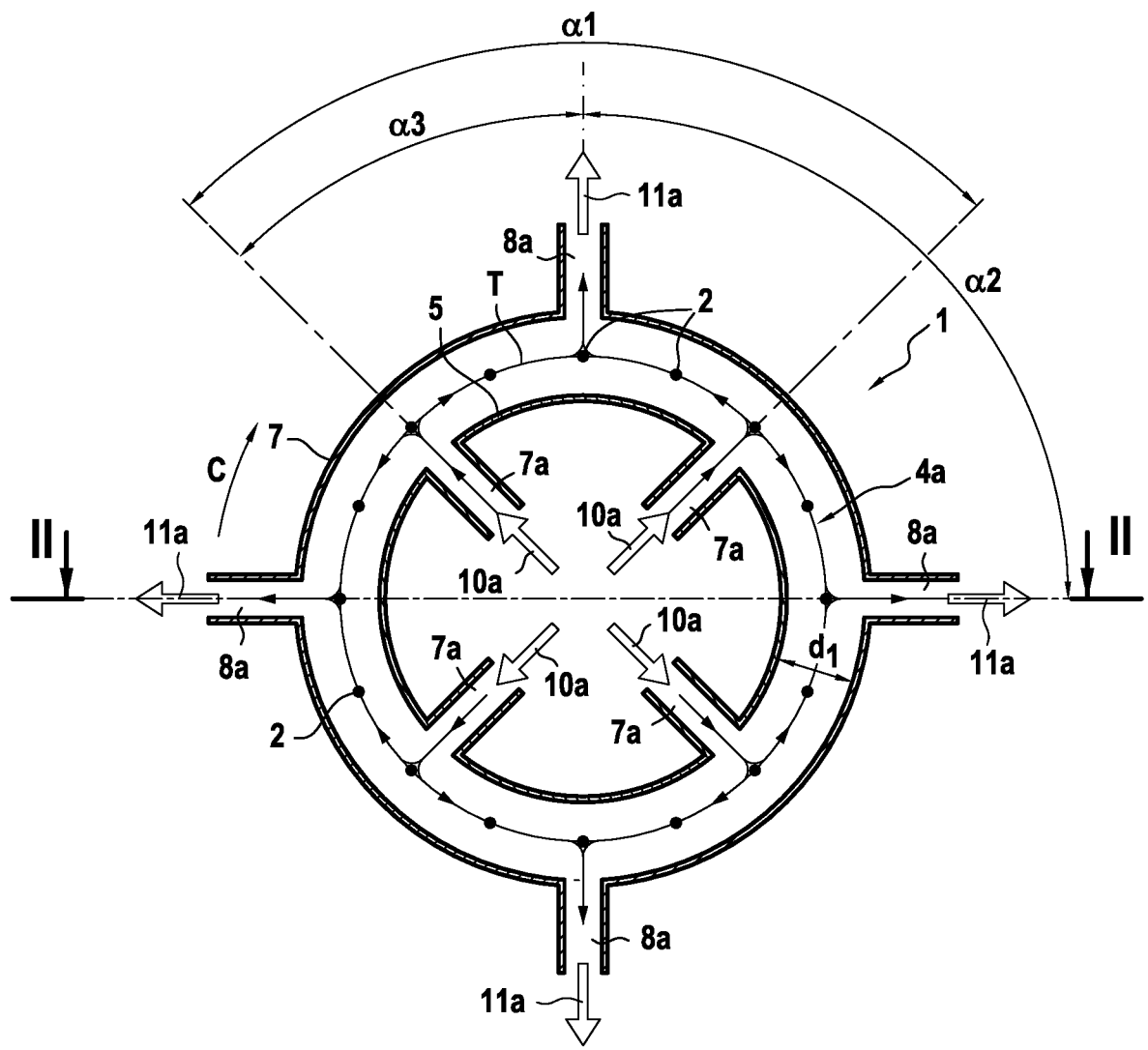
FIG. 1 is a diagrammatic view of a device of the invention in section perpendicularly to the longitudinal axis of the treatment chamber.

FIG. 1 shows a device 1 of the invention for coating a plurality of yarns 2 by a vapor deposition method.

As shown in FIG. 1 in particular, the device 1 comprises a treatment chamber defining a first treatment zone 4a in which the yarns 2 are to be coated by performing a vapor deposition method. The yarns 2 that are to be coated in the first treatment zone 4a are not interlinked (in particular the yarns are not woven, knitted, or braided together). The yarns 2 have not been subjected to any textile operation and they do not form a fiber structure. The yarns 2 may be made of a ceramic material, e.g. an oxide, nitride, or carbide material, e.g. silicon carbide (SiC). In a variant, the yarns may be carbon yarns. In an embodiment, a portion of the yarns 2 are made of ceramic material and a portion of the yarns 2 are made of carbon. In an embodiment, at least yarns, e.g. 20 to 200 yarns may be treated simultaneously in the first treatment zone 4a. The first treatment zone 4a is present between an internal circumferential wall 5 and an external circumferential wall 7. The treatment chamber 4 is radially defined by the internal circumferential wall 5 and by the external circumferential wall 7. The first zone 4a is annular in shape when observed in section perpendicularly to the longitudinal axis of the treatment chamber. In the example shown in FIG. 1, the first zone 4a is generally circular in shape when observed in section perpendicular to the longitudinal axis of the treatment chamber. Nevertheless, it would not go beyond the ambit of the invention for the first zone to have some other shape when observed in section perpendicularly to the longitudinal axis of the treatment chamber, such as a shape that is generally elliptical or polygonal, e.g. rectilinear or square. The yarns 2 are distributed in circumferential manner in the first zone 4a. Such a distribution of yarns 2 around the circumference of the first zone 4a serves advantageously to increase the number of yarns treated per unit time compared with yarns being distributed along the diameter of the treatment zone. The device 1 also includes a first injector device (not shown) configured to inject a first treatment gas phase 10a into the first zone 4a through a plurality of inlet orifices 7a present in the internal circumferential wall 5. In the example shown, each inlet orifice 7a is present in the internal circumferential wall 5. The device 1 also has a first removal device (not shown) configured to remove the residual first gas phase 11a from the first zone 4a though a plurality of outlet orifices 8a present in the external circumferential wall 7. In the example shown, each outlet orifice 8a is present in the external circumferential wall 7. The first removal device is configured to remove the residual first gas phase from the treatment chamber. In order to remove the residual first gas phase, each outlet orifice 8a is in communication with suction means such as a vacuum pump (not shown). Each of the inlet orifices 7a and outlet orifices 8a is situated in a common plane perpendicular to the longitudinal axis of the treatment chamber (this plane corresponding to the section plane of FIG. 1, and to the plane P shown in FIG. 2). In addition, the inlet orifices 7a and the outlet orifices 8a are offset around the circumferential direction C of the treatment chamber. More precisely, in the example of FIG. 1, each outlet orifice 8a is positioned between two consecutive inlet orifices 7a around the circumferential direction C. In other words, on moving through the zone 4a around the circumferential direction C, inlet orifices 7a and outlet orifices 8a alternate, i.e. an inlet orifice 7a is passed, followed by an outlet orifice 8a, followed by an inlet orifice 7a, and so on. Furthermore, in the example shown, the inlet orifices 7a and the outlet orifices 8a are uniformly distributed around the circumferential direction C. FIG. 1 shows the path of the first gas phase in the first zone 4a (path referenced T). Because of the suction taking place through the outlet orifices 8a, the first gas phase is present along an annulus in the first zone 4a when the first zone 4a is observed in section perpendicularly to the longitudinal axis of the treatment chamber. This path of the first gas phase serves to treat in uniform manner the yarns positioned in annular manner in the first zone 4a.

The angular difference $\alpha_1$ between two consecutive inlet orifices 7a around the circumferential direction C may be greater than or equal to 15°. The angular difference $\alpha_1$ may be less than or equal to 90°, and in particular this angular difference may lie in the range 15° to 90°. In the example shown, this angular difference is substantially equal to 90°. The number of inlet orifices 7a may be greater than or equal to four. The number of inlet orifices 7a may be less than or equal to 25, and for example it may lie in the range 4 to 25. The distance $d_1$ between the internal circumferential wall 5 and the external circumferential wall 7 may be greater than or equal to 0.02 meters (m). This distance $d_1$ may be less than or equal to 0.1 m, and for example may lie in the range 0.02 m to 0.1 m. The distance $d_1$ is measured perpendicularly to the longitudinal axis of the treatment chamber.

The angular difference $\alpha_2$ between two consecutive outlet orifices 8a around the circumferential direction C may be greater than or equal to 15°. The angular difference $\alpha_2$ may be less than or equal to 180°, and in particular this angular difference may lie in the range 15° to 180°. In the example shown, this angular difference is substantially equal to 90°. The ratio between the number of outlet orifices 8a and the number of inlet orifices 7a may lie in the range 0.5 to 1. Advantageously, this ratio is equal to 1 in order to obtain a coating that particularly uniform among the various treated yarns. The number of outlet orifices 8a may be greater than or equal to two. The number of outlet orifices 8a may be less than or equal to 25, and for example may lie in the range 2 to 25. The angular difference $\alpha_3$ between an inlet orifice 7a and a consecutive outlet orifice 8a around the circumferential direction C may be greater than or equal to 7.5°. The angular difference $\alpha_3$ may be less than or equal to 135°, and in particular this angular difference may lie in the range 7.5° to 135°. Unless mentioned to the contrary, the angular difference between two orifices corresponds to the angular difference between the centers of those two orifices.

In a variant that is not shown, the inlet orifices may be present in the external circumferential wall and the outlet orifices may be present in the internal circumferential wall. The properties described above, in particular in terms of the relative arrangement of the inlet orifices and of the outlet orifices and in terms of angular differences are likewise applicable to this embodiment. In a variant that is not shown, it is possible to have a single inlet orifice and a single outlet orifice, e.g. situated in a position that is diametrically opposite the position of the inlet orifice.

Figure 2:
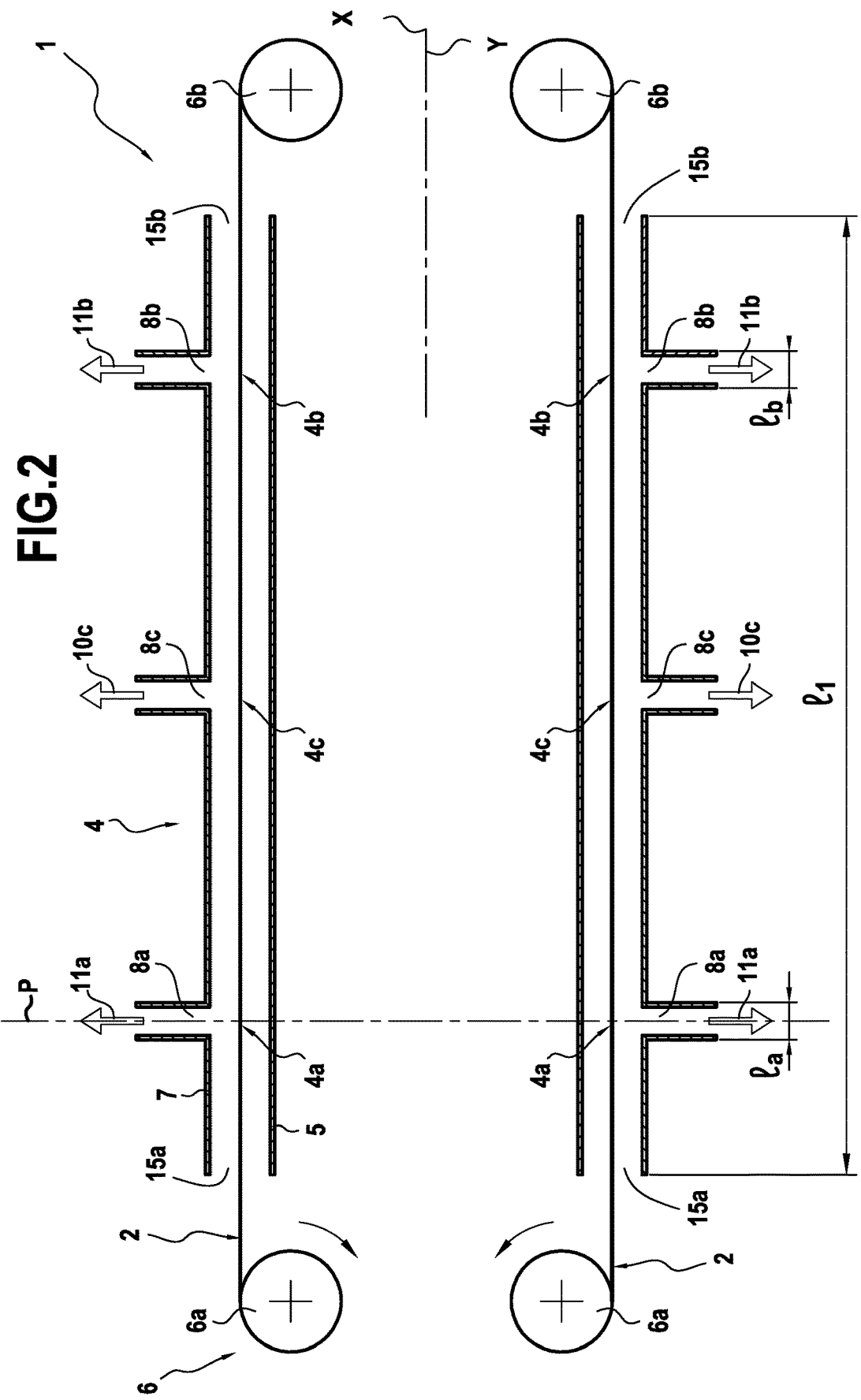
FIG. 2 is a diagram of the FIG. 1 device in section along the longitudinal axis of the treatment chamber.

The treatment chamber 4 extends between a first inlet end 15a and a second inlet end 15b along a longitudinal axis X (see FIG. 2). FIG. 2 also shows the plane P that is perpendicular to the longitudinal axis X in which the inlet and outlet orifices 7a and 8a are situated.

By way of example, the treatment chamber 4 may present a length $l_1$ greater than or equal to 0.5 m, and by way of example lying in the range 0.5 m to 5 m. The length $l_1$ of the treatment chamber 4 corresponds to the distance between the inlet end 15a and the outlet end 15b as measured along the longitudinal axis X. The first treatment zone 4a may present a length $l_a$ measured along the longitudinal axis X that is greater than or equal to 0.01 m, and for example that lies in the range 0.01 m to 0.2 m.

In addition, the device 1 includes a conveyor system 6 that, in the example shown, comprises a plurality of pulleys 6a and 6b. A first set of pulleys 6a is situated facing the inlet end 15a and a second set of pulleys 6b is situated facing the outlet end 15b. The first and second sets of pulleys 6a and 6b are positioned in annular manner along the longitudinal axis X. The yarns 2 are tensioned between the pulleys 6a and 6b and they are tensioned between the inlet and outlet ends 15a and 15b. The conveyor system 6 is configured to transport the yarns 2 in the treatment chamber 4 through the first zone 4a along a conveyor axis Y. In the example shown, the conveyor axis Y is parallel to the longitudinal axis X. The conveyor axis Y is shown as being rectilinear in the example of FIG. 2. The conveyor system 6 is configured to transport the yarns 2 through the treatment chamber 4 over its entire length $l_1$. The internal and external circumferential walls 5 and 7 both extend along the longitudinal axis X of the treatment chamber 4. The conveyor system 6 is configured to transport the yarns 2 between the internal circumferential wall 5 and the external circumferential wall 7.

The treatment chamber 4 may also define a second treatment zone 4b that is offset from the first treatment zone 4a along the longitudinal axis X and along the conveyor axis Y, as shown in FIG. 2. The second treatment zone 4b presents the same properties as the first treatment zone 4a in terms of the positioning of the inlet orifice(s) and outlet orifice(s) 8b. The presence of this second treatment zone 4b is optional. When the chamber 4 defines a second treatment zone 4b, the device 1 may also have a second injector device configured to inject a second treatment gas phase into the second treatment zone 4b through at least one inlet orifice, which second treatment gas phase is different from the first treatment gas phase. Still in this configuration, the device 1 may also include a second removal device configured to remove the residual second gas phase 11b from the second zone 4b through at least one second outlet orifice 8b. The inlet orifice(s) and outlet orifice(s) opening out into the second zone 4b are situated in a common plane perpendicular to the longitudinal axis X and they are offset around the circumferential direction of the treatment chamber. On being transported by the conveyor system 6, the yarns 2 pass through the first zone 4a and then through the second zone 4b. The second treatment zone 4b may present a length $l_b$ measured along the longitudinal axis X that is greater than or equal to 0.01 m, and that lies for example in the range 0.01 m to 0.2 m.

In the example shown in FIG. 2, the treatment chamber 4 also defines a barrier zone 4c situated between the first and second zones 4a and 4b along the conveyor axis Y. The yarns 2 pass through the barrier zone 4c while they are being transported by the conveyor system 6. In the example shown in FIG. 2, while the yarns 2 are being transported by the conveyor system 6, they pass in succession through the first zone 4a, then through the barrier zone 4c, and then through the second zone 4b. The presence of the barrier zone 4c is optional. In the example shown, the device 1 also includes an injector device for injecting an inert gas phase (not shown) that is configured to inject an inert gas phase 10c into the barrier zone 4c. The inert gas phase 10c is injected through at least one inert gas phase inlet orifice. The inert gas phase 10c is removed from the barrier zone 4c and from the treatment chamber 4 via an inert gas phase removal device (not shown) through at least one inert gas phase removal orifice 8c. The arrangement of the inert gas phase inlet and outlet orifices may be identical to the arrangement of the inlet and outlet orifices in the first and second zones. By way of example, the inert gas phase may comprise $N_2$ and/or argon (Ar). The inert gas phase present in the barrier zone acts as a "gas curtain" that serves, should that be desired, to reduce or even avoid mixing between the first and second gas phases.

The example device 1 shown in FIG. 2 has a treatment chamber 4 defining two treatment zones 4a and 4b, with a distinct layer being formed by a vapor deposition method in each of the zones 4a and 4b. Such a device 1 serves to form a two-layer coating on the yarns 2 by vapor deposition. The presence of the barrier zone 4c serves to avoid any mixing of the first and second gas phases, and thus makes it possible to obtain a clean interface between the two layers formed in the first and second zones 4a and 4b.

In a variant that is not shown, the treatment chamber defines a single treatment zone, such a device serving to form a single-layer coating on the yarns by vapor deposition. Also in a variant, the treatment chamber could define at least three treatment zones as to perform a coating made up of at least three layers. In a variant that is not shown, it is possible to omit the presence of the barrier zone 4c.

Figure 3:
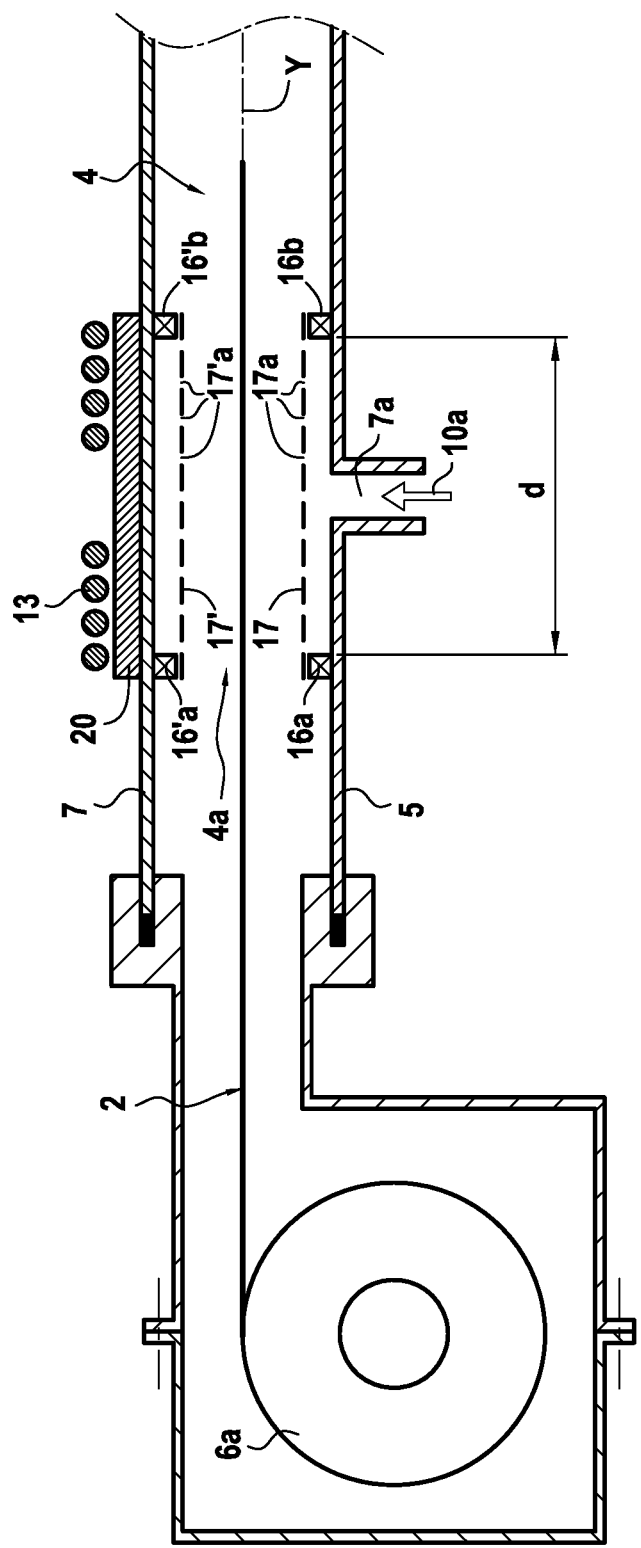
FIG. 3 is a view in section along the longitudinal axis of the treatment chamber showing an inlet orifice of the FIG. 1 device in greater detail.
Figure 4:
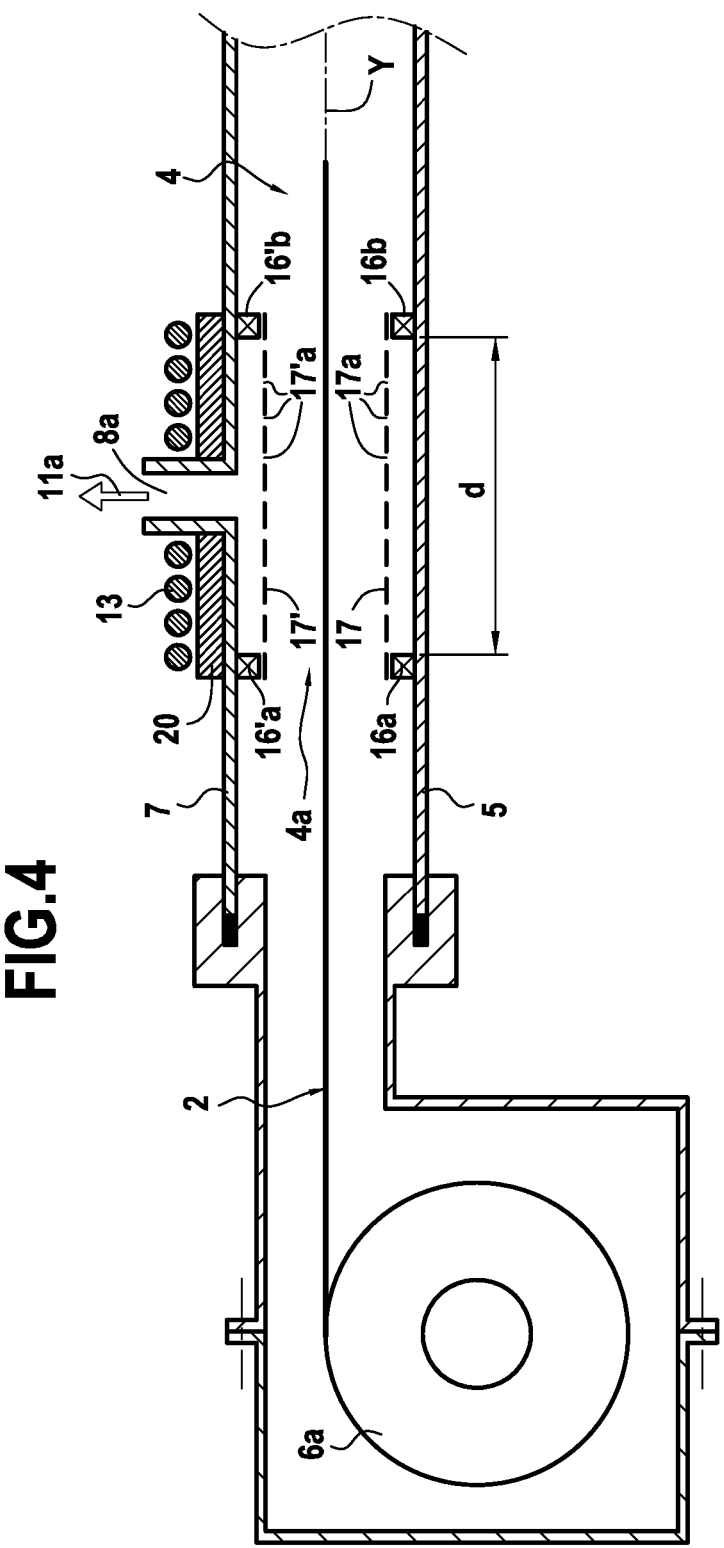
FIG. 4 is a section view along the longitudinal axis of the treatment chamber showing an outlet orifice of the FIG. 1 device in greater detail.

FIGS. 3 and 4 show details of the device 1 shown in FIGS. 1 and 2 relating to the first treatment zone 4a, it being understood that the same structures are present in the second treatment zone 4b, when such a zone is present. FIG. 3 is a fragmentary view of the device 1 in longitudinal section through an inlet orifice 7a, and FIG. 4 is a fragmentary view of the device 1 in longitudinal section through an outlet orifice 8a. The device 1 has a heater system configured to heat the first treatment zone 4a in order to perform vapor deposition. More precisely, the heater system comprises a susceptor 20 and an induction coil 13. In the example shown, the susceptor 20 is present outside the treatment chamber 4 and it surrounds the first zone 4a. In the example shown, the susceptor 20 heats the external circumferential wall 7 that defines the treatment chamber 4 so as to heat the first zone 4a in order to perform vapor deposition. It is also possible to place an additional heater system facing the internal circumferential wall 5 (which additional system is not shown in FIGS. 3 and 4 and may involve resistive or induction heating). The susceptor 20 is inductively coupled with an induction coil 13 that is likewise situated outside the treatment chamber 4. First and second perforated grids 17 and 17' are present in the treatment chamber 4, each grid presenting a respective plurality of through perforations 17a and 17'a. The first perforated grid 17 is present facing the inlet orifices 7a (see FIG. 3) and the second perforated grid 17' is present facing the outlet orifices 8a (see FIG. 4). Each of these grids 17 and 17' is annular in shape when observed in section perpendicularly to the longitudinal axis X. The first perforated grid 17 serves to provide fluid flow communication between the inlet orifices 7a and the treatment zone 4a. The second perforated grid 17' serves to provide fluid flow communication between the treatment zone 4a and the outlet orifices 8a. Thus, the first treatment zone 4a is radially defined by the first perforated grid 17 and by the second perforated grid 17'. The first zone 4a is situated between the first and second perforated grids 17 and 17'. First upstream and downstream gaskets 16a and 16b are present between the first perforated grid 17 and the internal circumferential wall 5. Second upstream and downstream gaskets 16'a and 16'b are present between the second perforated grid 17' and the external circumferential wall 7. The first gaskets 16a and 16b serve to channel the first gas phase 10a towards the first zone 4a. The second gaskets 16'a and 16'b serve to channel the residual first gas phase 11a towards the outlet orifices 8a.

When performing the vapor deposition coating method, the first gas phase 10a is injected through the inlet orifices 7a and then flows through the perforations 17a in the first perforated grid 17 in order to penetrate into the first zone 4a in which vapor deposition takes place. As mentioned above, once in the first zone 4a, the first gas phase is present in that zone 4a around a ring. The residual first gas phase 11a then flows through the perforations 17'a in the second perforated grid 17' towards the outlet orifices 8a in order to be removed. The first zone 4a is defined along the conveyor axis Y by the first upstream and downstream gaskets 16a and 16b. In other words, the length $l_a$ of the first zone 4a is less than or equal to the distance d between the first upstream gasket 16a and the first downstream gasket 16b, with the length $l_a$ and the distance d being measured along the conveyor axis Y.

In a variant that is not shown, the susceptor is present in the treatment chamber 4 and defines the first zone laterally. Under such circumstances, the susceptor presents a plurality of through perforations, and by way of example it occupies the position of the second perforated grid.

In order to coat the yarns 2 in an interphase coating, it is possible to perform the following method. The yarns 2 are initially transported through the first zone 4a. The first gas phase 10a is injected through the first inlet orifices 7a by the first injector device, while the yarns 2 are being transported continuously through the first zone 4a. The treatment with the first gas phase 10a serves to form a first interphase coating layer by chemical vapor deposition from the first gas phase onto the yarns 2 while they are being transported through the first zone 4a. The yarns coated in the first interphase coating layer then pass through the barrier zone 4c, and they are then transported by the conveyor system 6 to the second treatment zone 4b. In this second zone 4b, a second treatment gas phase 10b is injected through inlet orifices by the second injector device in order to form a second interphase coating layer by chemical vapor deposition from the second gas phase onto the yarns already coated in the first layer. The gas phases for performing chemical vapor deposition comprise one or more precursors of the material for the layer that is to be formed. The gas phases may comprise a single gas or a mixture of gases. When a carbon interphase coating is to be formed, the gas phases may comprise one or more gaseous hydrocarbons, e.g. selected from methane, ethane, propane, and butane. In a variant, the gas phases may include a gaseous precursor for a ceramic material, such as methyl trichlorosilane (MTS). In order to make a given deposit, selecting the precursor(s) to be used together with the pressure and temperature conditions to be imposed in the treatment chamber 4 form part of the general knowledge of the person skilled in the art. The yarns 2 are transported continuously by the conveyor system 6 between the inlet first end 15a and the outlet second end 15b of the treatment chamber 4. In addition, the yarns 2 pass once only through the treatment chamber 4 in the example shown (no return towards the first end 15a once the yarns have reached the second end 15b). By way of example, the travel speed imposed on the yarns 2 throughout all or part of their path through the treatment chamber 4 may be greater than or equal to 0.01 meters per minute (m/min). The travel speed imposed on the yarns 2 throughout all or part of their path through the treatment chamber 4 may be less than or equal to 2 m/min, and for example may lie in the range 0.01 m/min to 2 m/min. As mentioned above, the conveyor system 6 may advantageously include an element for adjusting the travel speed of the yarns 2 through the treatment chamber 4. By varying the travel speed of the yarns 2, a user can thus modify the transit time of the yarns in the treatment zone(s), and consequently modify the thickness of the layer(s) formed on the yarns. Once the travel speed has been set, persons skilled in the art can use their general knowledge to determine values for the flow rates of the gas phases to be used in order to obtain the desired vapor deposition. By way of example, the flow rate of the first injected gas phase and/or the flow rate of the second injected gas phase may be greater than or equal to 0.01 liters per minute (L/min), e.g. lying in the range 0.01 L/m to 50 L/m.

Example

An interphase coating of boron nitride (BN) was deposited by a vapor deposition method on a plurality of yarns traveling through a treatment zone of a treatment chamber of the type shown in FIG. 1. The yarns were carbon yarns or yarns made of ceramic material (SiC or Si—C—O yarns, such as Nicalon®, Hi-Nicalon®, or Hi-Nicalon® Type S yarns from the supplier Nippon Carbon). A treatment gas phase was injected into the treatment zone through the inlet orifices 7a and the residual gas phase was removed from said zone through the outlet orifices 8a. The angular differences $\alpha_1$ and $\alpha_2$ were 36° and the angular difference $\alpha_3$ was 18°. There were thus ten inlet orifices and ten outlet orifices. The length of the arc between two consecutive inlet orifices around the circumferential direction was 0.15 m. The diameter of the external circumferential wall 7 was 0.5 m and the diameter of the internal circumferential wall 5 was 0.45 m. The value of the travel speed of the yarns through the treatment zone was imposed at 50 millimeters per minute (mm/min). The heating length (i.e. the length of the susceptor) was 220 millimeters (mm) and the diameter of the susceptor was 550 mm. The following parameters were imposed in order to perform vapor deposition:

- temperature: 1100° C.;
- coefficient alpha (corresponding to the ratio of $NH_3$ volume flow rate divided by $BCl_3$ volume flow rate): 1.3;
- coefficient beta (corresponding to the ratio of the $N_2$ flow rate divided by the volume flow rate of $BCl_3$ plus the volume flow rate of $NH_3$): 1;
- total pressure: 0.2 kilopascals (kPa);
- transit time 87 milliseconds (ms); and
- duration of the treatment: 300 minutes (min).

More precisely, the following flow rates were imposed for the treatment gas phase (these flow rates are given for feeding all ten inlet orifices):

- $H_2$: 2.02 L/min;
- $NH_3$: 1.14 L/min;
- $BCl_3$: 0.88 L/min;
- total: 4.03 L/min.

Those treatment conditions made it possible to obtain a boron nitride interphase coating having a thickness of 300 nanometers (nm) that was highly crystalline and uniform, and concentric in terms of the thickness and the length of the deposit.

The term "lying in the range . . . to . . . " should be understood as including the bounds.

The invention claimed is:

1. A device for coating one or more yarns by a vapor deposition method, the device comprising:
    a treatment chamber extending along a longitudinal axis and having at least one treatment zone that is annular in shape situated between an internal circumferential wall and an external circumferential wall, and within which at least one yarn is to be coated by performing a vapor deposition method;
    a conveyor system;
    an injector device configured to inject a treatment gas phase into the treatment zone through at least one inlet orifice present in the internal or external circumferential wall; and a removal device configured to remove the residual gas phase from the treatment zone through at least one outlet orifice present in the internal or external circumferential wall, said inlet orifice and said outlet orifice being situated in a common plane perpendicular to the longitudinal axis of the treatment chamber and being offset around a circumferential direction of the treatment chamber, the conveyor system being configured to transport said at least one yarn through the treatment zone along the longitudinal axis, the conveyor system comprising at least a first conveyor element located at a first longitudinal end of the treatment chamber and at least a second conveyor element located at a second longitudinal end of the treatment chamber, the treatment zone being located between the first and second conveyor elements, wherein the inlet orifice is situated in one of the internal or external circumferential wall, and the outlet orifice is situated in the other of the internal or external circumferential wall.

2. A device according to claim 1, comprising a plurality of inlet orifices and a plurality of outlet orifices.

3. A device according to claim 2, wherein the inlet orifices and the outlet orifices are offset so that each of the outlet orifices is positioned between two inlet orifices around the circumferential direction.

4. A device according to claim 2, said inlet orifices and said outlet orifices being uniformly distributed around the circumferential direction.

5. A device according to claim 1, wherein the travel speed of said at least one yarn through the treatment chamber is adjustable.

6. A method of treating one or more yarns by a vapor deposition method by using a device, the device including a treatment chamber extending along a longitudinal axis and having at least one treatment zone that is annular in shape situated between an internal circumferential wall and an external circumferential wall, and within which at least one yarn is to be coated by performing a vapor deposition method;

a conveyor system;

an injector device configured to inject a treatment gas phase into the treatment zone through at least one inlet orifice present in the internal or external circumferential wall; and a removal device configured to remove the residual gas phase from the treatment zone through at least one outlet orifice present in the internal or external circumferential wall, said inlet orifice and said outlet orifice being situated in a common plane perpendicular to the longitudinal axis of the treatment chamber and being offset around a circumferential direction of the treatment chamber, the conveyor system being configured to transport said at least one yarn through the treatment zone along the longitudinal axis, the conveyor system comprising at least a first conveyor element located at a first longitudinal end of the treatment chamber and at least a second conveyor element located at a second longitudinal end of the treatment chamber, the treatment zone being located between the first and second conveyor elements, wherein the inlet orifice is situated in one of the internal or external circumferential wall, and the outlet orifice is situated in the other of the internal or external circumferential wall, the method comprising:

using the injector device to inject the gas phase into the treatment zone through said inlet orifice;

using the conveyor system to cause at least one yarn to be transported through the treatment zone so as to form a layer on said at least one yarn by vapor deposition from the injected gas phase; and removing the residual gas phase from the treatment zone through said outlet orifice.

7. A method according to claim 6, wherein said at least one yarn is transported continuously by the conveyor system through the treatment chamber.

8. A method according to claim 6, wherein the layer is formed by chemical vapor deposition or by reactive chemical vapor deposition.

9. A method according to claim 6, wherein the layer is an interphase coating layer.

10. A method of fabricating a composite material part, the method comprising:

coating a plurality of yarns with an interphase coating at least by performing a method according to claim 9;

forming a fiber preform by performing one or more textile operations on yarns as coated in this way with the interphase coating; and densifying the fiber preform with a matrix in order to obtain a composite material part.

* * * * *